United States Patent [19]

Young

[11] 3,731,196

[45] May 1, 1973

[54] METHOD AND APPARATUS FOR ELIMINATING COUNT SCATTER INTRODUCED BY PHASE-LOCKED LOOP FREQUENCY MULTIPLIERS

[75] Inventor: Byron A. Young, Palo Alto, Calif.

[73] Assignee: Varian Associates, Palo Alto, Calif.

[22] Filed: Dec. 20, 1971

[21] Appl. No.: 209,912

[52] U.S. Cl. ................324/0.5 E, 324/78 D, 324/189

[51] Int. Cl. ..........................G01r 23/02, G01r 33/08

[58] Field of Search ..................324/0.5, 78 D, 79 D, 324/189

[56] References Cited

UNITED STATES PATENTS

| | | | |
|---|---|---|---|
| 3,070,745 | 12/1962 | Serson | 324/0.5 |
| 3,090,002 | 5/1963 | Allen | 324/0.5 |
| 3,304,504 | 2/1967 | Horlander | 324/78 D |
| 3,559,057 | 1/1971 | Huggett | 324/79 D |

*Primary Examiner*—Alfred E. Smith
*Attorney*—Stanley Z. Cole et al.

[57] ABSTRACT

A frequency measuring system for use, for example, in an atomic resonance magnetometer device, comprising a phase-locked loop multiplier system to which the incoming AC signal is delivered including a voltage controlled oscillator having an operating frequency at a multiple of the frequency of the incoming signal, counter means being employed to count the cycles of the VCO signal output as a measure of the frequency of the incoming signal, the means for transmitting the VCO output signal to said counter means being synchronized with said incoming frequency signal to insure that the count is initiated at a predetermined point during the cycle of the incoming frequency signal.

12 Claims, 7 Drawing Figures

METHOD AND APPARATUS FOR ELIMINATING COUNT SCATTER INTRODUCED BY PHASE-LOCKED LOOP FREQUENCY MULTIPLIERS

BACKGROUND OF THE INVENTION

Certain forms of frequency counting systems employ phase-locked loop frequency multiplier techniques for substantially increasing the frequency of the incoming signal by a predetermined multiplier N, and thereafter counting the frequency of the multiplied frequency to obtain an improved resolution in the frequency count.

Such systems include a phase detector, one input of which is the incoming variable frequency signal *f*. The other input to the phase detector is derived from the output frequency signal of a tunable frequency source, such as a voltage controlled oscillator, operating at approximately N*f*, said oscillator output passing through a frequency divider which divides the frequency N*f* by N to deliver an alternating frequency signal at approximately the frequency *f* to the second input of the phase detector. The phase detector operates to compare the incoming alternating frequency signal with the alternating frequency signal obtained from the VCO and frequency divider and produces a DC error signal dependent on the difference between the two incoming signals. This DC error signal is utilized in a feedback loop to tune the voltage controlled oscillator to the frequency *f* of the incoming signal, and thus this phase-locked loop is locked to the frequency *f*. A gate circuit delivers pulses at the output frequency rate N*f* of the VCO to a counter circuit where the pulses are counted for a predetermined period of time, the counter therefore registering a count directly related to the frequency of the incoming signal.

A system of this type is shown as used in a nuclear free precession magnetometer system in U.S. Pat. No. 3,070,745 issued Dec. 25, 1962, to P.H. Serson entitled "Proton Precession Magnetometer". In such a magnetometer, a sample of material containing nuclei such as water is placed in the unidirectional magnetic field to be measured, for example the earth's magnetic field. A strong unidirectional polarizing magnetic field is applied to the sample at an angle to the earth's magnetic filed to polarize the nuclei in the direction of the strong field. This strong field is then abruptly terminated, leaving the nuclei to freely precess in the earth's magnetic field at a frequency rate termed the Larmor frequency which frequency is directly dependent on the strength of the earth's magnetic field. The freely precessing nuclei induce an alternating signal at the Larmor precession frequency *f* in a pick-up coil surrounding the sample, the induced signal lasting for several seconds until it decays into noise. The free precession frequency of a proton is about 2,000 cycles per second in the earth's magnetic field. The resolution of the instrument is substantially enhanced by multiplying this precession frequency by a suitable factor N, for example, 1000, to give a frequency of about 200 K cycles per second and thereafter counting this multiplied frequency over a fixed period of time to obtain a count proportionately related to the incoming frequency *f* and thus a measure of the magnetic field strength. The start of the count is delayed for a suitable period, for example, 0.25 seconds after the termination of the polarizing magnetic field, to give the phase-locked loop time to lock onto the frequency *f*.

The phase-locked loop frequency multipliers in such frequency counting systems have an AC ripple on the phase detector output which is related in frequency and phase to the incoming signal. This AC ripple results in the introduction of frequency modulation noise on the output signal of the voltage controlled oscillator to the counter, resulting in a tendency for the counter readings to scatter about the correct value on successive frequency counts. This FM noise can often be reduced to a large extent by designing the low pass filter in the feedback loop between the phase detector and the VCO to reject most of the ripple. However, the high frequency rejection by the filter must be compromised with the loop response time; very high ripple rejection results in slow loop response and a large contribution from the VCO to the VCO output noise. It is possible to construct phase detectors with negligible output ripple but the circuitry tends to be complex.

SUMMARY OF THE PRESENT INVENTION

In the present invention, the error in the output count readings of a phase-locked loop multiplier frequency counting system due to scatter count is eliminated by insuring that the turn-on of the gate between the counter and the voltage controlled oscillator is synchronized with the incoming alternating frequency signal such that each successive count by the system is initiated at the same point in the cycle of the incoming signal as each preceeding count. As a consequence, small changes in the incoming frequency signal, resulting, for example, from small changes in the earth's magnetic field being measured with a magnetometer system, are more easily detected in the counter output.

In one embodiment of the invention, the gate interval is initiated in synchronism with one of the zero crossings of the incoming alternating frequency signal, each successive count interval starting at the same zero crossing point in the cycle.

In existing magnetometers, the gate turn on is initiated from the programmer that controls the turn on and turn off of the polarizing magnetic field. In this invention, the gate circuit is reset from the programmer, and the turn on of the gate is initiated by the next zero crossing of the incoming alternating signal.

DESCRIPTION OF THE PREFERRED EMBODIMENTS

Figure 1:
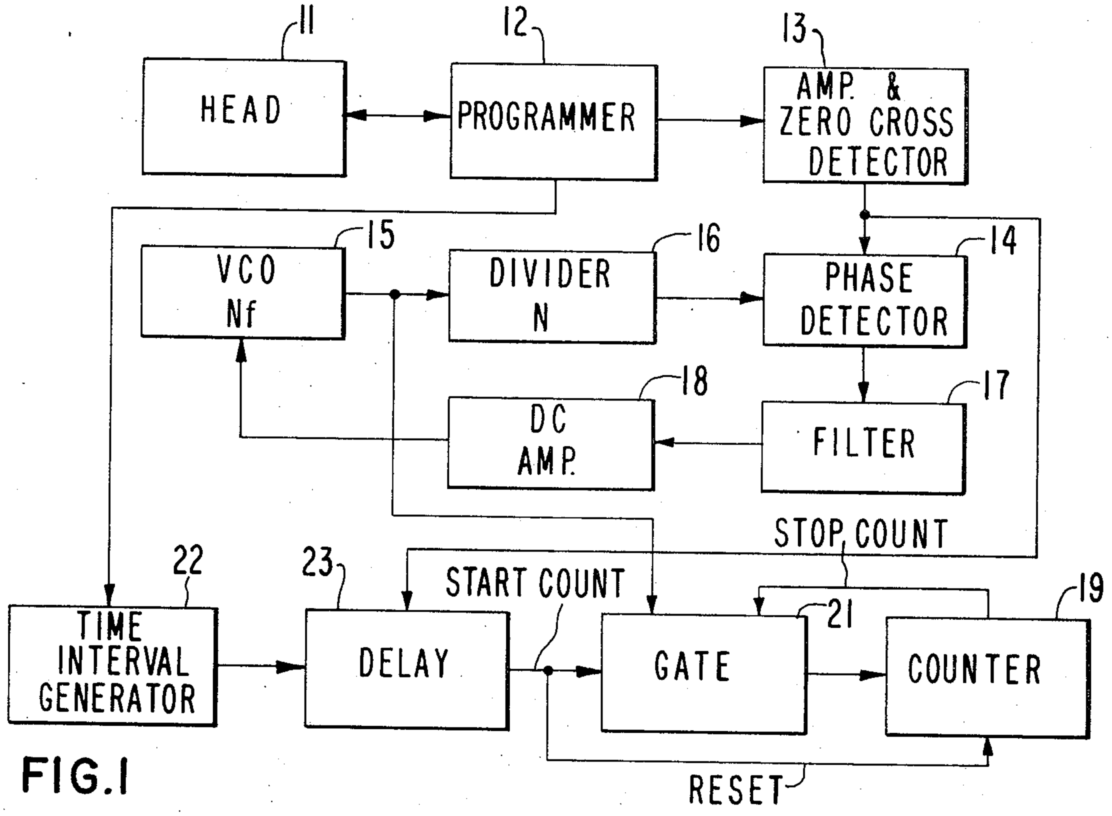
FIG. 1 is a block diagram of a nuclear free precession magnetometer incorporating the present invention.

Referring now to FIG. 1, the nuclear free precession magnetometer system in which the present invention may be utilized comprises a head portion 11 which includes the water or kerosine sample and a coil surrounding the sample positioned in the magnetic field to be measured. A programmer 12 supplies DC current to the coil surrounding the sample to produce a very strong unidirectional magnetic field at an angle to the magnetic field to be measured, for example, the earth's magnetic field, for a short period of time sufficient to produce polarization of the nuclei in the sample. The programmer then abruptly terminates the DC current and the polarizing field rapidly decays, leaving the nuclei to freely precess in the earth's magnetic field at the Larmor frequency *f*. The precessing nuclei induce an alternating frequency current in a pick-up coil, generally the same coil as the polarizing coil, this free induction decay signal lasting for several seconds. This free precession signal is transmitted to a suitable amplifier and zero crossing detector circuit 13, the output of the amplifier consisting of positive going pulses at the positive going zero crossing of the incoming signal and negative going pulses at the negative going zero crossing of the signal. This alternating signal is transmitted to one input of a phase detector circuit 14 in a phase-locked loop multiplier circuit. The output from a voltage controlled oscillator 15 operating at approximately N*f*, where N is a known and predetermined multiplier, for example 1,000, is transmitted to a divider circuit 16 where the signal is divided by N to produce an output signal at approximately *f*. This output is sent to the second input of the phase detector circuit 14 where the two incoming signals are compared to produce a DC output directly related to the phase difference between the two inputs. This output error signal is transmitted via filter 17 and DC amplifier 18 to the voltage controlled oscillator 15 to tune it to the exact frequency *f* and thus lock the phase-locked loop onto the incoming frequency signal. There is thus produced a frequency exactly N times as great as the frequency of the free precession signal.

The multiplied frequency N*f* from the VCO is transmitted to the counter 19 via the gate circuit 21 in the form of pulses, the pulses being counted for a predetermined period of time to provide a frequency rate directly related to the strength of the measured magnetic field. The gate turn on time is controlled from a time interval generator 22 which in turn is controlled from the system programmer circuit 12 so that the gate 21 will be turned on at some time after the polarizing magnetic field has been terminated. This period after polarization turn off is provided to allow the polarizing magnetic field to suitably decay and to permit the phase-locked loop to lock in on the incoming free precession frequency signal f. In prior systems, this time delay was a fixed time interval, for example, 0.25 seconds, after the polarization turn off. In the present invention, an additional delay is introduced by delay circuit 23 for reasons explained below.

Figures 2A, 2B, 2C, 2D, 2E:
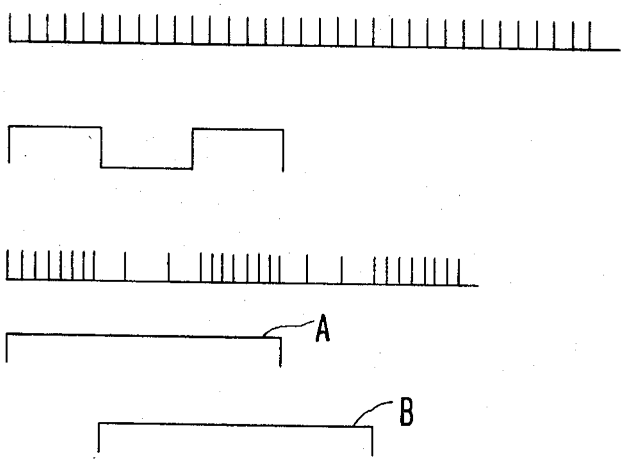
FIGS. 2(a) – 2(e) are pulse diagrams which illustrate the problem of scatter count.

Referring now to FIG. 2(a), there is shown an ideal pulse pattern output for the VCO 15 for a times 10 multiplication of an incoming frequency *f* represented by the trace 2(b). The times 10 multiplication is utilized only to illustrate the scatter count problem encountered in the phase-locked loop multiplication systems. Generally, most forms of phase detectors in the phase-locked loop system have an AC ripple on their output which is related in frequency and phase to the incoming alternating signal *f*. This AC ripple causes a frequency modulation of the pulse output from the VCO of the form shown exaggerated in FIG. 2(c). The result of the FM is that a cyclic variation occurs in the pulse spacing so that there are regions of greater than average number of pulses and regions of less than average number of pulses. An exaggerated bunching of output pulses is used for convenient illustration; the grouping of eight pulses in the first half of the input cycle and two pulses in the second half is arbitrary.

This FM can often be reduced to a large extent by designing the low-pass filter in the phase-locked loop to reject most of the ripple. However, the high frequency rejection by the filter must be compromised with the loop response time; very high ripple rejection results in low loop response and a large contribution to the output noise from the VCO.

Customarily the gate 21 between the VCO 15 and the counter 19 is operated under the control of the programmer 12 at some fixed time relative to an event such as the polarization turn off. The gate 21 therefore opens at random points along the cycle of the incoming frequency signal *f*; one such gate period (A) starting with the positive going zero crossover point of the signal in FIG. 2(b) is illustrated in FIG. 2(d) and a second gate period (B) commencing at the negative going zero crossover is illustrated in 2(e). Each gate length is equal to 1 ½ period of the input signal *f* to simplify the illustration. It is noted that the gate (A) interval covers two dense periods and one less dense period of pulses from the VCO shown in FIG. 2(c) whereas the gate interval (B) covers only one dense period and two less dense periods of the VCO output. The count during gate period (A) will provide 18 counts whereas a count during the period (B) will provide 12 counts; the same count periods under ideal pulse counting of FIG. 2(a) would always provide 15 counts. Thus there is a scatter count of ±3 about the average count of 15 due to the FM. A change in input frequency *f* equivalent to one count will be lost in the scatter, and can be detected only be averaging over many counter readings. Thus, small changes in the magnetic field being measured remain undetected.

However, if the initiation of the transmission of the pulses to counter is synchronized with a particular point in the cycle of the incoming signal *f* such as the positive going zero cross-over point as represented by counter interval (A), the count will always include the same regions of the VCO pulse output relative to the incoming signal cycle, in this case the two dense regions and the less dense region of FIG. 2(c). Therefore, each count will be 18 pulses which still contains the 3 pulse error but eliminates the scatter count of ±3. Small changes in the incoming frequency *f* are now more likely to be observed.

An input frequency change equivalent to an ideal VCO frequency change of one count in the gate interval would produce a count change of one or two for a gate ending in a dense region of the modulated VCO output, whereas the change of one count in the gate interval ending in a thin portion of the modulated VCO output would produce a count change of zero or one. Therefore, if the correct count change were one, the change observed counting the modulated VCO output in this example with a synchronized gate would be zero, one or two counts, and by synchronizing the gate to the input signal *f*, the error in observing a small frequency change is ±1 count instead of ±3 counts with an unsynchronized gate.

In the present embodiment of the invention, the delay circuit 23 is first reset by the pulse output from the time interval generator 22 in response to the start count signal from the programmer 12, and the delay circuit 23 is thereafter operated by the next positive going output pulse from the amplifier 13 to provide a "-start count" command to reset the counter 19 and open the gate 21 to start the count from the VCO in synchronism with the zero crossing of the incoming signal. The counter then counts for the predetermined time interval as determined by a variable setting in the counter to give the desired readout in magnetic field strength.

Figure 3:
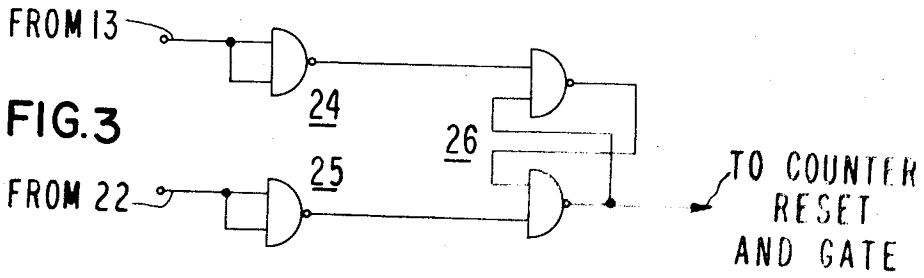
FIG. 3 is a schematic diagram of a suitable delay circuit for use in the magnetometer system of FIG. 1.

A simple form of delay circuit is shown in FIG. 3 and includes two inverters 24 and 25 and a flip-flop 26. Before receipt of a start count signal from the time interval generator 22, a high is on the input to inverter 25 and a low on the output to the flip-flop, holding the flip-flop output to the gate 21 high. At the start count command, the input to inverter 25 goes low, and the output goes high to the flip-flop. On receipt of the next positive spike on the input of inverter 24 from amplifier 13, the output of inverter 24 goes low, and the output of the associated gate goes high to drive the output of the flip-flop low to reset the counter 19 and open the gate 21 to start the flow of pulses from the VCO to the counter.

At the end of the count interval, the counter 19 transmits a "stop count" command to the gate 21 to close the gate and terminate the pulse flow. The delay circuit 23 is reset at the start of the next magnetometer cycle by the programmer 12 and time interval generator 22, e.g. at the polarize interval.

Although the present invention has been described with reference to its use in a nuclear free precession magnetometer, it is equally applicable in other forms of magnetometers where an atomic resonance frequency is magnetic field dependent, such as an alkali vapor optically pumped magnetometer, and a phase-locked loop multiplier is utilized for frequency counting. It is also noted that the invention is applicable to such frequency counting systems in general, and not limited to magnetometer systems.

What is claimed is:

1. A frequency measuring system for precision determination of the frequency of an incoming AC signal comprising
   - a phase-locked loop multiplier system to which said incoming signal is delivered including a voltage controlled oscillator having an output frequency at a multiple of the frequency of the incoming signal,
   - means for measuring said output frequency of said voltage controlled oscillator as a measure of the frequency of said incoming signal,
   - means for transmitting said output signal from said voltage controlled oscillator to said frequency measuring means for a predetermined time interval
   - and means for synchronizing the initiation of said transmission with a predetermined point in the cycle of said incoming frequency signal.

2. A frequency measuring system as claimed in claim 1 wherein said synchronizing means comprises means for synchronizing the initiation of transmission with one of the zero crossings of said incoming signal.

3. A frequency measuring system as claimed in claim 1 wherein said means for transmitting said output signal to said measuring means comprises a gate circuit coupled between the voltage controlled oscillator and the measuring means, said synchronizing means controlling the time at which turn on of said gate occurs.

4. A magnetometer system comprising
   - means for producing precessions of atom portions at their Larmor frequency of precession in a magnetic field to be measured and converting said precessions to an incoming alternating signal,
   - a phase-locked loop multiplier system coupled to said means for receiving said incoming signal and including a voltage controlled oscillator operating at a multiple of the frequency of the incoming signal,
   - means for measuring the output frequency of said voltage controlled oscillator as a measure of the strength of said magnetic field,
   - means for transmitting the output signal from said voltage controlled oscillator to said frequency measuring means for a predetermined time interval,
   - and means for synchronizing the initiation of said transmission with a predetermined point in the cycle of the incoming precession frequency signal.

5. A magnetometer system as claimed in claim 4 wherein said magnetometer is a nuclear free precession magnetometer.

6. A magnetometer system as claimed in claim 4 wherein said magnetometer is an atomic resonance magnetometer.

7. A magnetometer system as claimed in claim 4 wherein said means for transmitting said output signal to said frequency measuring means comprises a gate circuit coupled between said voltage controlled oscillator and the measuring means, said synchronizing means controlling the time at which the turn on of said gate occurs.

8. A magnetometer system as claimed in claim 4 wherein said synchronizing means comprises means for synchronizing the gate opening with one of the zero crossings of said incoming signal.

9. A frequency counting system for determining the frequency of an incoming alternating signal of variable frequency $f$ comprising,
   - a phase detector,
   - a voltage controlled oscillator for producing an alternating signal output at approximately $Nf$, where N is a predetermined number greater than 1,
   - a frequency divider circuit for dividing the alternating signal $Nf$ from the oscillator by N to produce an output at approximately $f$, said signal output from the divider and said incoming alternating signal being transmitted as two inputs to said phase detector to produce an error signal output from the detector related to the frequency difference between the two input signals,
   - a feedback circuit for coupling said error signal to said voltage controlled oscillator to thereby tune said oscillator to the frequency $Nf$,
   - a frequency counter,
   - a gate circuit for transmitting the output signal of said voltage controlled oscillator to said frequency counter for a predetermined time interval, said counter measuring the frequency thereof, and means for controlling the turn on time of said gate in synchronism with the incoming alternating signal so that each successive frequency counting interval commences at a predetermined point in the cycle of the incoming alternating signal.

10. A frequency counting system as claimed in claim 9 wherein said last means operates in response to one of the zero crossings of the incoming signal cycle.

11. A method for determining the frequency of an incoming alternating signal of variable frequency $f$ comprising the steps of producing a variable multiplied alternating signal at approximately N$f$, where N is a predetermined multiplier greater than 1, dividing the variable alternating signal N$f$ by N to produce an output at approximately $f$, comparing said divided alternating signal output and said incoming alternating signal to produce an error signal related to the frequency difference between the two signals, said error signal tuning the variable multiplied alternating signal to the frequency N$f$, counting the frequency N$f$ of said variable alternating signal for a predetermined time period, and synchronizing the start of said counting time period with a predetermined point in the cycle of the incoming alternating signal.

12. The method as claimed in claim 11 wherein the step of synchronizing the start of the count with the incoming signal comprises synchronizing with one of the zero crossings of the incoming signal.

* * * * *